(12) United States Patent
Chen

(10) Patent No.: US 9,772,640 B2
(45) Date of Patent: Sep. 26, 2017

(54) VOLTAGE SELECTING CIRCUIT CAPABLE OF SUCCESSFULLY TURNING ON INTERNAL TRANSISTOR EVEN IF THE DIFFERENCE BETWEEN INPUT VOLTAGES IS LESS THAN THRESHOLD VOLTAGE OF INTERNAL TRANSISTOR

(71) Applicant: Realtek Semiconductor Corp., Hsinchu (TW)

(72) Inventor: Shih-Chieh Chen, Yilan County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/296,337

(22) Filed: Oct. 18, 2016

(65) Prior Publication Data

US 2017/0199539 A1    Jul. 13, 2017

(30) Foreign Application Priority Data

Jan. 11, 2016    (TW) .............................. 105100667 A

(51) Int. Cl.
  *G05F 1/625*    (2006.01)
  *H03K 5/24*    (2006.01)
  *H03K 17/56*    (2006.01)

(52) U.S. Cl.
  CPC .............. *G05F 1/625* (2013.01); *H03K 5/24* (2013.01); *H03K 17/56* (2013.01)

(58) Field of Classification Search
  CPC .......... H03K 5/151; H03K 3/01; H03K 3/013; H03K 3/03; H03K 5/133; H03K 5/134; H03K 5/08

USPC ................ 327/108, 109, 288, 319, 436, 333
See application file for complete search history.

(56) References Cited

U.S. PATENT DOCUMENTS

| 8,022,778 | B2 | 9/2011 | Nagaraj et al. | |
| 8,031,020 | B1 * | 10/2011 | Tu | H03K 3/013 |
| | | | | 331/117 FE |
| 8,415,979 | B2 * | 4/2013 | Chao | H03K 19/00384 |
| | | | | 326/82 |

OTHER PUBLICATIONS

Taiwanese Office Communication for Application No. 105100667 dated Jan. 24, 2017.

* cited by examiner

*Primary Examiner* — John Poos
(74) *Attorney, Agent, or Firm* — Birch, Stewart, Kolasch & Birch, LLP

(57) ABSTRACT

A voltage selecting circuit includes: a first transistor, having a first terminal coupled with a first input terminal and having a second terminal coupled with a voltage output terminal; a second transistor, having a first terminal coupled with a second input terminal and having a second terminal coupled with the voltage output terminal; a first resistor positioned between the first input terminal and a control terminal of the second transistor; a second resistor positioned between the second input terminal and a control terminal of the first transistor; a first current adjusting circuit coupled with the control terminal of the first transistor; a second current adjusting circuit coupled with the control terminal of the second transistor; a comparison circuit for comparing voltages at the first and second input terminals; and a control circuit configured to operably control the first current adjusting circuit and the second current adjusting circuit.

10 Claims, 2 Drawing Sheets

VOLTAGE SELECTING CIRCUIT CAPABLE OF SUCCESSFULLY TURNING ON INTERNAL TRANSISTOR EVEN IF THE DIFFERENCE BETWEEN INPUT VOLTAGES IS LESS THAN THRESHOLD VOLTAGE OF INTERNAL TRANSISTOR

CROSS-REFERENCE TO RELATED APPLICATIONS

This application claims the benefit of priority to Patent Application No. 105100667, filed in Taiwan on Jan. 11, 2016; the entirety of which is incorporated herein by reference for all purposes.

BACKGROUND

The disclosure generally relates to a voltage selecting circuit and, more particularly, to a voltage selecting circuit capable of maintaining normal operation even if the difference between input voltages is less than the threshold voltage of the transistors of the voltage selecting circuit.

Voltage selecting circuits are widely used to select either the greatest voltage or the smallest voltage among multiple input voltages to be an output voltage.

Transistors are typically employed as the voltage switching elements in the conventional voltage selecting circuits. Accordingly, the transistors often unable to successfully switch when the difference among the input voltages is less than the threshold voltage of the transistors, thereby causing the conventional voltage selecting circuit to output an erroneous voltage signal.

SUMMARY

An example embodiment of a voltage selecting circuit is disclosed, comprising: a first input terminal, arranged to operably receive a first input voltage; a second input terminal, arranged to operably receive a second input voltage; a voltage output terminal, arranged to operably provide an output voltage; a first transistor, wherein a first terminal of the first transistor is coupled with the first input terminal while a second terminal of the first transistor is coupled with the voltage output terminal; a second transistor, wherein a first terminal of the second transistor is coupled with the second input terminal while a second terminal of the second transistor is coupled with the voltage output terminal; a first resistor, positioned on a first signal path between the first input terminal and a control terminal of the second transistor; a second resistor, positioned on a second signal path between the second input terminal and a control terminal of the first transistor; a first current adjusting circuit, coupled with the control terminal of the first transistor; a second current adjusting circuit, coupled with the control terminal of the second transistor; a comparing circuit, coupled with the first input terminal and the second input terminal, arranged to operably compare the first input voltage with the second input voltage; and a control circuit, coupled with the first current adjusting circuit, the second current adjusting circuit, and the comparing circuit, arranged to operably control the first current adjusting circuit and the second current adjusting circuit according to a comparison result of the comparing circuit.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
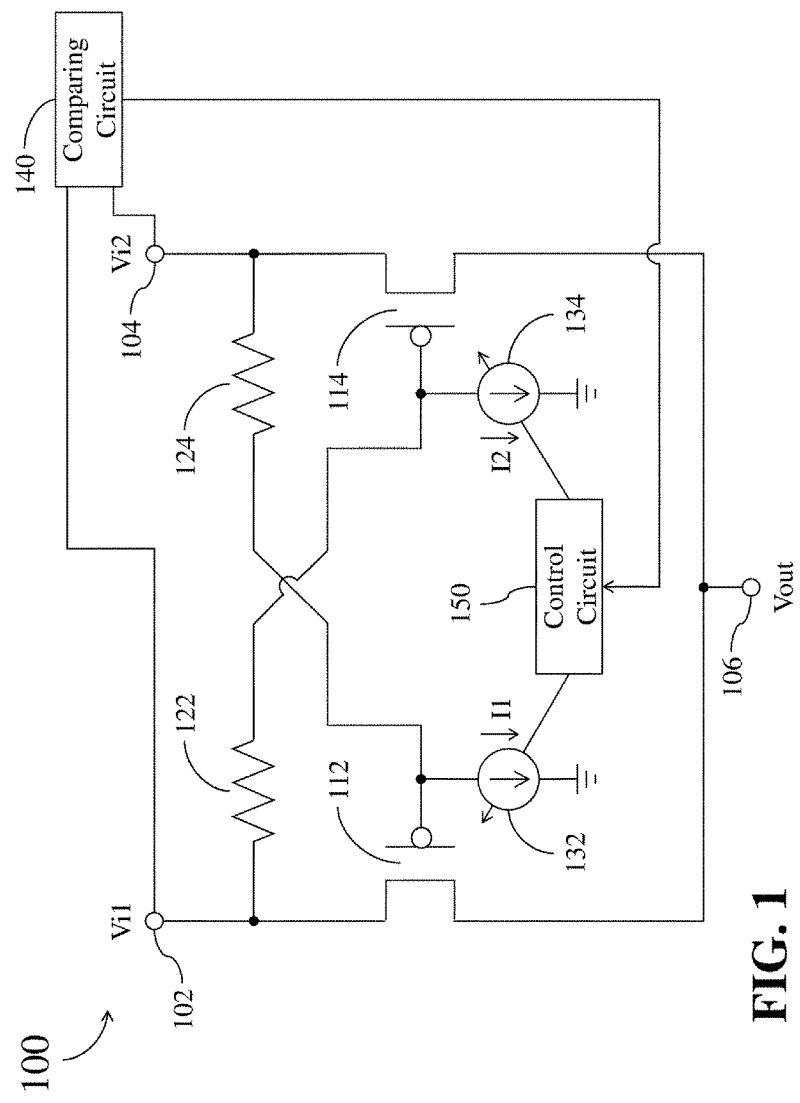
FIG. 1 shows a simplified functional block diagram of a voltage selecting circuit according to a first embodiment of the present disclosure.

FIG. 1 shows a simplified functional block diagram of a voltage selecting circuit 100 according to a first embodiment of the present disclosure. As shown in FIG. 1, the voltage selecting circuit 100 comprises a first input terminal 102, a second input terminal 104, a voltage output terminal 106, a first transistor 112, a second transistor 114, a first resistor 122, a second resistor 124, a first current adjusting circuit 132, a second current adjusting circuit 134, a comparing circuit 140, and a control circuit 150.

In the voltage selecting circuit 100, the first input terminal 102 is arranged to operably receive a first input voltage Vi1, the second input terminal 104 is arranged to operably receive a second input voltage Vi2, and the voltage output terminal 106 is arranged to operably provide an output voltage Vout.

The first terminal of the first transistor 112 is coupled with the first input terminal 102 while the second terminal of the first transistor 112 is coupled with the voltage output terminal 106. Similarly, the first terminal of the second transistor 114 is coupled with the second input terminal 104 while the second terminal of the second transistor 114 is coupled with the voltage output terminal 106.

The first resistor 122 is positioned on a first signal path between the first input terminal 102 and the control terminal of the second transistor 114. The second resistor 124 is positioned on a second signal path between the second input terminal 104 and the control terminal of the first transistor 112. In this embodiment, for example, one terminal of the first resistor 122 is coupled with the first input terminal 102 while another terminal of the first resistor 122 is coupled with the control terminal of the second transistor 114. Similarly, one terminal of the second resistor 124 is coupled with the second input terminal 104 while another terminal of the second resistor 124 is coupled with the control terminal of the first transistor 112.

The first current adjusting circuit 132 is coupled with the control terminal of the first transistor 112 while the second current adjusting circuit 134 is coupled with the control terminal of the second transistor 114.

The comparing circuit 140 is coupled with the first input terminal 102 and the second input terminal 104, and arranged to operably compare the first input voltage Vi1 with the second input voltage Vi2.

The control circuit 150 is coupled with the first current adjusting circuit 132, the second current adjusting circuit 134, and the comparing circuit 140. The control circuit 150 is arranged to operably control the first current adjusting circuit 132 and the second current adjusting circuit 134 according to the comparison result of the comparing circuit 140.

When the control circuit 150 turns on the first current adjusting circuit 132, the first current adjusting circuit 132 sinks a first predetermined current I1 from the aforementioned second signal path. When the control circuit 150 turns on the second current adjusting circuit 134, the second current adjusting circuit 134 sinks a second predetermined current I2 from the aforementioned first signal path. In other words, each of the first current adjusting circuit 132 and the second current adjusting circuit 134 functions as a current sink.

In the voltage selecting circuit 100, a first predetermined voltage Vd1 generated by multiplying the magnitude of the second predetermined current I2 by a resistance R1 of the first resistor 122 is greater than a threshold voltage Vth2 of the second transistor 114. Additionally, a second predetermined voltage Vd2 generated by multiplying the magnitude of the first predetermined current I1 by a resistance R2 of the second resistor 124 is greater than a threshold voltage Vth1 of the first transistor 112.

In operations, the control circuit 150 may turn on only one of the first current adjusting circuit 132 and the second current adjusting circuit 134 in the same period of time.

In the embodiment of FIG. 1, for example, each of the first transistor 112 and the second transistor 114 is realized with a PMOS transistor. When the comparing circuit 140 determines that the first input voltage Vi1 is greater than the second input voltage Vi2, the control circuit 150 may turn on the first current adjusting circuit 132 and turn off the second current adjusting circuit 134.

In this situation, even if the difference between the first input voltage Vi1 and the second input voltage Vi2 is less than the threshold voltage Vth1 of the first transistor 112, the first transistor 112 can still be successfully turned on because the voltage currently at the control terminal of the first transistor 112 is a resulting voltage obtained by subtracting the second predetermined voltage Vd2 from the second input voltage Vi2. As a result, the output voltage Vout would be equal to the first input voltage Vi1.

On the contrary, when the comparing circuit 140 determines that the first input voltage Vi1 is less than the second input voltage Vi2, the control circuit 150 may turn on the second current adjusting circuit 134 and turn off the first current adjusting circuit 132.

In this situation, even if the difference between the first input voltage Vi1 and the second input voltage Vi2 is less than the threshold voltage Vth2 of the second transistor 114, the second transistor 114 can still be successfully turned on because the voltage currently at the control terminal of the second transistor 114 is a resulting voltage obtained by subtracting the first predetermined voltage Vd1 from the first input voltage Vi1. As a result, the output voltage Vout would be equal to the second input voltage Vi2.

In can be appreciated from the foregoing descriptions that the disclosed voltage selecting circuit 100 is suitable to be utilized as a greatest voltage selector for selecting the greatest voltage among multiple input voltages.

Figure 2:
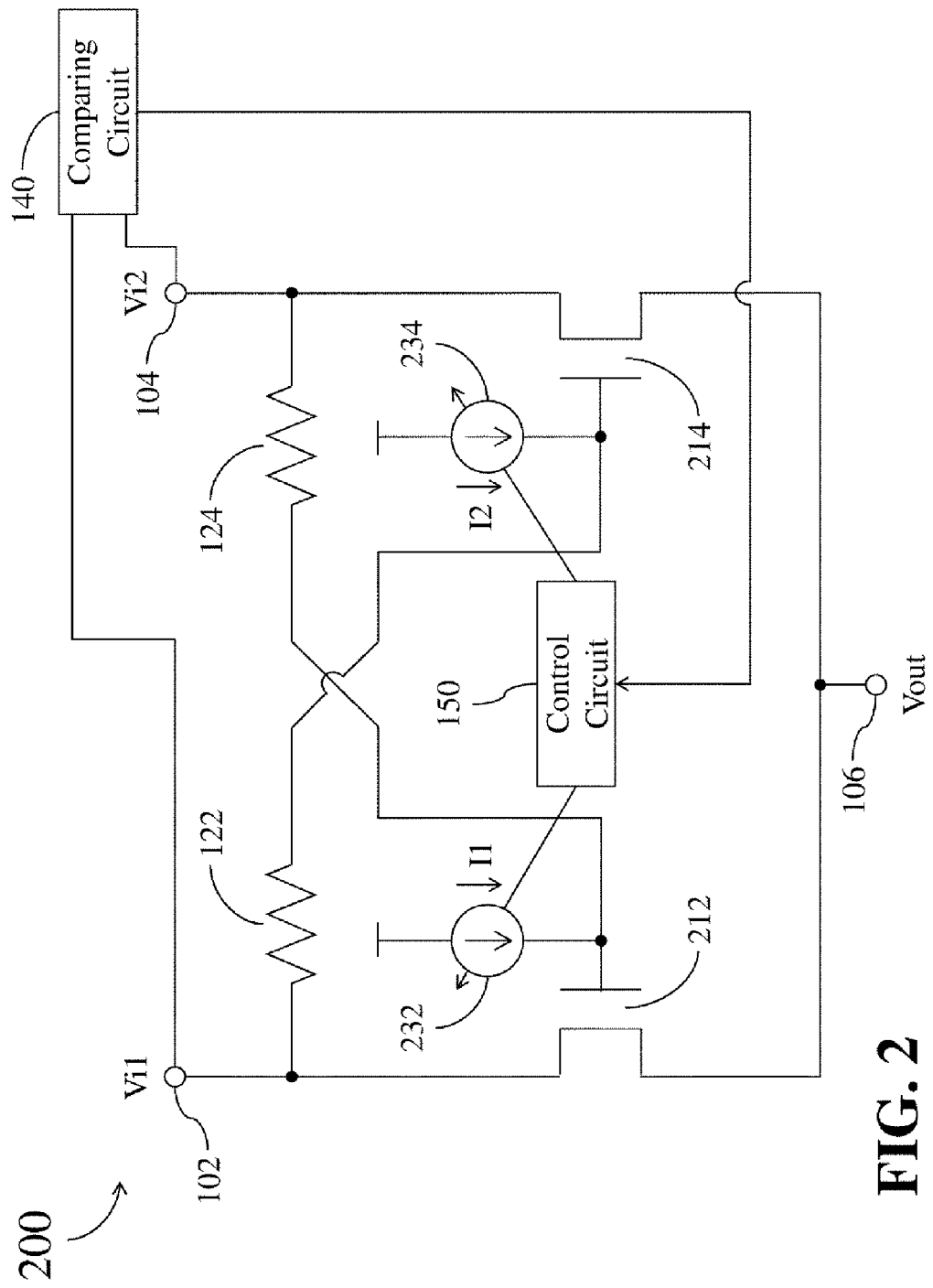
FIG. 2 shows a simplified functional block diagram of a voltage selecting circuit according to a second embodiment of the present disclosure.

FIG. 2 shows a simplified functional block diagram of a voltage selecting circuit 200 according to a second embodiment of the present disclosure. As shown in FIG. 2, the voltage selecting circuit 200 comprises the first input terminal 102, the second input terminal 104, the voltage output terminal 106, a first transistor 212, a second transistor 214, the first resistor 122, the second resistor 124, a first current adjusting circuit 232, a second current adjusting circuit 234, the comparing circuit 140, and the control circuit 150.

The connections and operations of the first input terminal 102, the second input terminal 104, the voltage output terminal 106, and the comparing circuit 140 of the voltage selecting circuit 200 are the same as the corresponding elements in the embodiment in FIG. 1.

In the voltage selecting circuit 200, the first terminal of the first transistor 212 is coupled with the first input terminal 102 while the second terminal of the first transistor 212 is coupled with the voltage output terminal 106. Similarly, the first terminal of the second transistor 214 is coupled with the second input terminal 104 while the second terminal of the second transistor 214 is coupled with the voltage output terminal 106.

The first resistor 122 is positioned on a first signal path between the first input terminal 102 and the control terminal of the second transistor 214. Additionally, the second resistor 124 is positioned on a second signal path between the second input terminal 104 and the control terminal of the first transistor 212. In this embodiment, for example, one terminal of the first resistor 122 is coupled with the first input terminal 102 while another terminal of the first resistor 122 is coupled with the control terminal of the second transistor 214. Similarly, one terminal of the second resistor 124 is coupled with the second input terminal 104 while another terminal of the second resistor 124 is coupled with the control terminal of the first transistor 212.

The first current adjusting circuit 232 is coupled with the control terminal of the first transistor 212 while the second current adjusting circuit 234 is coupled with the control terminal of the second transistor 214.

The control circuit 150 is coupled with the first current adjusting circuit 232, the second current adjusting circuit 234, and the comparing circuit 140. The control circuit 150 is arranged to operably control the first current adjusting circuit 232 and the second current adjusting circuit 234 according to the comparison result of the comparing circuit 140.

When the control circuit 150 turns on the first current adjusting circuit 232, the first current adjusting circuit 232 provides a first predetermined current I1 to the second signal path. When the control circuit 150 turns on the second current adjusting circuit 234, the second current adjusting circuit 234 provides a second predetermined current I2 to the first signal path. In other words, each of the first current adjusting circuit 232 and the second current adjusting circuit 234 functions as a current source.

Similar to the voltage selecting circuit 100, a first predetermined voltage Vd1 generated by multiplying the magnitude of the second predetermined current I2 in the voltage selecting circuit 200 the resistance R1 of the first resistor 122 is greater than a threshold voltage Vth2 of the second transistor 214. Additionally, a second predetermined voltage Vd2 generated by multiplying the magnitude of the first predetermined current I1 by the resistance R2 of the second resistor 124 is greater than a threshold voltage Vth1 of the first transistor 212.

In operations, the control circuit 150 may turn on only one of the first current adjusting circuit 232 and the second current adjusting circuit 234 in the same period of time.

In the embodiment of FIG. 2, for example, each of the first transistor 212 and the second transistor 214 is realized with a NMOS transistor. When the comparing circuit 140 determines that the first input voltage Vi1 is greater than the second input voltage Vi2, the control circuit 150 may turn off the first current adjusting circuit 232 and turn on the second current adjusting circuit 234.

In this situation, even if the difference between the first input voltage Vi1 and the second input voltage Vi2 is less than the threshold voltage Vth2 of the second transistor 214, the second transistor 214 can still be successfully turned on because the voltage currently at the second transistor 214 is a resulting voltage obtained by adding the first predetermined voltage Vd1 to the first input voltage Vi1. As a result, the output voltage Vout would be equal to the second input voltage Vi2.

On the contrary, when the comparing circuit 140 determines that the first input voltage Vi1 is less than the second input voltage Vi2, the control circuit 150 may turn off the second current adjusting circuit 234 and turn on the first current adjusting circuit 232.

In this situation, even if the difference between the first input voltage Vi1 and the second input voltage Vi2 is less than the threshold voltage Vth1 of the first transistor 212, the first transistor 212 can still be successfully turned on because the voltage currently at the first transistor 212 is a resulting voltage obtained by adding the second predetermined voltage Vd2 to the second input voltage Vi2. As a result, the output voltage Vout would be equal to the first input voltage Vi1.

In can be appreciated from the foregoing descriptions that the disclosed voltage selecting circuit 200 is suitable to be utilized as a smallest voltage selector for selecting the smallest voltage among multiple input voltages.

In practice, the first predetermined current I1 and the second predetermined current I2 in the previous embodiments may be configured to substantially the same, while the first resistor 122 and the second resistor 124 may be designed to have substantially the same resistance, in order to simply the circuitry complexity.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The tem "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

The term "voltage signal" used throughout the description and the claims may be expressed in the format of a current in implementations, and the term "current signal" used throughout the description and the claims may be expressed in the format of a voltage in implementations.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A voltage selecting circuit (100; 200), comprising:
a first input terminal (102), arranged to operably receive a first input voltage (Vi1);
a second input terminal (104), arranged to operably receive a second input voltage (Vi2);
a voltage output terminal (106), arranged to operably provide an output voltage (Vout);
a first transistor (112; 212), wherein a first terminal of the first transistor (112; 212) is coupled with the first input terminal (102) while a second terminal of the first transistor (112; 212) is coupled with the voltage output terminal (106);
a second transistor (114; 214), wherein a first terminal of the second transistor (114; 214) is coupled with the second input terminal (104) while a second terminal of the second transistor (114; 214) is coupled with the voltage output terminal (106);
a first resistor (122), positioned on 6a first signal path between the first input terminal (102) and a control terminal of the second transistor (114; 214);
a second resistor (124), positioned on a second signal path between the second input terminal (104) and a control terminal of the first transistor (112; 212);
a first current adjusting circuit (132; 232), coupled with the control terminal of the first transistor (112; 212);
a second current adjusting circuit (134; 234), coupled with the control terminal of the second transistor (114; 214);
a comparing circuit (140), coupled with the first input terminal (102) and the second input terminal (104), arranged to operably compare the first input voltage (Vi1) with the second input voltage (Vi2); and
a control circuit (150), coupled with the first current adjusting circuit (132; 232), the second current adjusting circuit (134; 234), and the comparing circuit (140), arranged to operably control the first current adjusting circuit (132; 232) and the second current adjusting circuit (134; 234) according to a comparison result of the comparing circuit (140),
wherein the output voltage (Vout) is equal to one of the first input voltage (Vi1) and the second input voltage (Vi2) when the control circuit (150) turns on the first current adjusting circuit (132; 232) and turns off the second current adjusting circuit (134; 234) or when the control circuit (150) turns off the first current adjusting circuit (132; 232) and turns on the second current adjusting circuit (134; 234).

2. The voltage selecting circuit (100; 200) of claim 1, wherein the control circuit (150) only turns on one of the first current adjusting circuit (132; 232) and the second current adjusting circuit (134; 234) in a same period of time.

3. The voltage selecting circuit (100; 200) of claim 2, wherein when the control circuit (150) turns on the first current adjusting circuit (132), the first current adjusting circuit (132) sinks a first predetermined current (I1) from the second signal path; and when the control circuit (150) turns on the second current adjusting circuit (134), the second current adjusting circuit (134) sinks a second predetermined current (2) from the first signal path.

4. The voltage selecting circuit (100; 200) of claim 3, wherein when the comparing circuit (140) determines that the first input voltage (Vi1) is greater than the second input voltage (Vi2), the control circuit (150) turns on the first current adjusting circuit (132) and turns off the second current adjusting circuit (134).

5. The voltage selecting circuit (100; 200) of claim 4, wherein a first predetermined voltage (Vd1) generated by multiplying a magnitude of the second predetermined current (I2) by a resistance (R1) of the first resistor (122) is greater than a threshold voltage (Vth2) of the second transistor (114), and a second predetermined voltage (Vd2) generated by multiplying a magnitude of the first predetermined current (I1) by a resistance (R2) of the second resistor (124) is greater than a threshold voltage (Vth1) of the first transistor (112).

6. The voltage selecting circuit (100; 200) of claim 5, wherein the first predetermined current (I1) and the second predetermined current (I2) have substantially same magnitude, while the first resistor (122) and the second resistor (124) have substantially same resistance.

7. The voltage selecting circuit (100; 200) of claim 2, wherein when the control circuit (150) turns on the first current adjusting circuit (232), the first current adjusting circuit (232) provides a first predetermined current (I1) to the second signal path; and when the control circuit (150) turns of the second current adjusting circuit (234), the second current adjusting circuit (234) provides a second predetermined current (I2) to the first signal path.

8. The voltage selecting circuit (100; 200) of claim 7, wherein when the comparing circuit (140) determines that the first input voltage (Vi1) is greater than the second input voltage (Vi2), the control circuit (150) turns off the first current adjusting circuit (232) and turns on the second current adjusting circuit (234).

9. The voltage selecting circuit (100; 200) of claim 8, wherein a first predetermined voltage (Vd1) generated by multiplying a magnitude of the second predetermined current (I2) by a resistance (R1) of the first resistor (122) is greater than a threshold voltage (Vth2) of the second transistor (214), and a second predetermined voltage (Vd2) generated by multiplying a magnitude of the first predetermined current (I1) by a resistance (R2) of the second resistor (124) is greater than a threshold voltage (Vth1) of the first transistor (212).

10. The voltage selecting circuit (100; 200) of claim 9, wherein the first predetermined current (I1) and the second predetermined current (I2) have substantially same magnitude, while the first resistor (122) and the second resistor (124) have substantially same resistance.

* * * * *